United States Patent
Moon et al.

(10) Patent No.: US 12,286,700 B2
(45) Date of Patent: Apr. 29, 2025

(54) MASK ASSEMBLY, DEPOSITION APPARATUS INCLUDING THE SAME, AND FABRICATING METHOD OF THE MASK ASSEMBLY

(71) Applicant: Samsung Display Co., Ltd., Yongin-si (KR)

(72) Inventors: Jae Suk Moon, Yongin-si (KR); Young Eun Ryu, Yongin-si (KR); Soo Hyun Min, Yongin-si (KR); Taek Kyo Kang, Yongin-si (KR); Min Ju Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 46 days.

(21) Appl. No.: 18/122,644

(22) Filed: Mar. 16, 2023

(65) Prior Publication Data

US 2023/0220535 A1    Jul. 13, 2023

Related U.S. Application Data

(62) Division of application No. 15/663,318, filed on Jul. 28, 2017, now Pat. No. 11,624,108.

(30) Foreign Application Priority Data

Sep. 27, 2016    (KR) .................. 10-2016-0124125

(51) Int. Cl.
C23C 14/04 (2006.01)
C23C 14/24 (2006.01)
(Continued)

(52) U.S. Cl.
CPC ............ *C23C 14/042* (2013.01); *C23C 14/24* (2013.01); *H10K 71/00* (2023.02); *C23C 14/04* (2013.01); *H10K 71/166* (2023.02)

(58) Field of Classification Search
CPC ............................ C23C 14/042; C23C 14/42
(Continued)

(56) References Cited

U.S. PATENT DOCUMENTS

| 4,652,460 A | 3/1987 | Shirahata |
| 9,105,865 B2 | 8/2015 | Chung et al. |

(Continued)

FOREIGN PATENT DOCUMENTS

| CN | 104561895 | 4/2015 |
| CN | 105940138 | 9/2016 |

(Continued)

OTHER PUBLICATIONS

Office Action dated May 19, 2023, issued to Korean Patent Application No. 10-2016-0124125.

(Continued)

*Primary Examiner* — Tabassom Tadayyon Eslami
(74) *Attorney, Agent, or Firm* — KILE PARK REED & HOUTTEMAN PLLC

(57) ABSTRACT

A mask assembly includes: a mask frame; a mask supported by the mask frame, the mask including a plurality of pattern holes; and a magnetic part disposed on one surface of the mask. The magnetic part provides a magnetic force between the mask and a target substrate and improves an adhesion between the mask and the target substrate to prevent deposition defects.

3 Claims, 2 Drawing Sheets

(51) Int. Cl.
*H10K 71/00* (2023.01)
*H10K 71/16* (2023.01)

(58) Field of Classification Search
USPC .................................................. 118/720, 721
See application file for complete search history.

(56) References Cited

U.S. PATENT DOCUMENTS

| | | | |
|---|---|---|---|
| 10,090,467 B2 | 10/2018 | Kawato et al. | |
| 2004/0202821 A1 | 10/2004 | Kim et al. | |
| 2005/0053764 A1 | 3/2005 | Nakadate | |
| 2005/0130422 A1 | 6/2005 | Theiss | |
| 2006/0191864 A1* | 8/2006 | Yotsuya | H10K 71/166 427/127 |
| 2009/0211595 A1 | 8/2009 | Sinha | |
| 2010/0055810 A1 | 3/2010 | Sung et al. | |
| 2011/0195638 A1 | 8/2011 | Sasaki et al. | |
| 2012/0126381 A1 | 5/2012 | Uenda et al. | |
| 2013/0133573 A1 | 5/2013 | Joo et al. | |
| 2015/0040826 A1 | 2/2015 | Jung et al. | |
| 2015/0068455 A1 | 3/2015 | Lee et al. | |
| 2016/0221017 A1 | 8/2016 | Huang | |
| 2017/0311411 A1 | 10/2017 | Takizawa et al. | |

FOREIGN PATENT DOCUMENTS

| | | | |
|---|---|---|---|
| JP | 2007-173107 | | 7/2007 |
| JP | 2008-309717 | | 12/2008 |
| KR | 10-2006-0081383 | | 7/2006 |
| KR | 10-2013-0057794 | | 6/2013 |
| KR | 10-2015-0017191 | | 2/2015 |
| KR | 10-2015-0029414 | | 3/2015 |
| KR | 10-1606558 | | 3/2016 |
| TW | 201629246 | * | 4/2015 |
| WO | 2016/060216 | | 4/2016 |
| WO | 2016063810 | * | 4/2016 |

OTHER PUBLICATIONS

Non-Final Office Action dated May 28, 2020, issued in U.S. Appl. No. 15/663,318.

Final Office Action dated Oct. 29, 2020, issued in U.S. Appl. No. 15/663,318.

Non-Final Office Action dated May 13, 2021, issued in U.S. Appl. No. 15/663,318.

Final Office Action dated Oct. 1, 2021, issued in U.S. Appl. No. 15/663,318.

Non-Final Office Action dated Mar. 3, 2022, issued in U.S. Appl. No. 15/663,318.

Final Office Action dated Jun. 16, 2022, issued in U.S. Appl. No. 15/663,318.

Notice of Allowance dated Dec. 9, 2022, issued in U.S. Appl. No. 15/663,318.

* cited by examiner

MASK ASSEMBLY, DEPOSITION APPARATUS INCLUDING THE SAME, AND FABRICATING METHOD OF THE MASK ASSEMBLY

CROSS-REFERENCE TO RELATED APPLICATIONS

The present application is a division of U.S. patent application Ser. No. 15/663,318, filed on Jul. 28, 2017, which claims priority from and the benefit of Korean Patent Application No. 10-2016-0124125, filed on Sep. 27, 2016, which is hereby incorporated by reference for all purposes as if fully set forth herein.

BACKGROUND

Field

Exemplary embodiments relate to a mask assembly, a deposition apparatus including the same, and a fabrication method of the mask assembly.

Discussion of the Background

In general, a deposition process of forming an organic thin film on a substrate may be used to fabricate an organic light emitting display panel. If a deposition material is charged and heated in an evaporation source of a chamber, a vapor of the evaporated deposition material is provided, and the evaporated deposition material passing through the pattern hole of a mask may be disposed onto the substrate. In such an organic thin film deposition process, it is important to induce uniform growth of an organic thin film on a substrate.

However, the thickness of a mask may be decreased to fabricate a high-resolution substrate. The mask and the substrate are adhered closely by a magnetic force. As the thickness of the mask decreases, the mass of the mask also decreases. Hence, the magnetic force between the mask and the substrate may also decrease, and the adhesion between the mask and the substrate is decreased. Accordingly, at least a part of the mask and the substrate may not be closely adhered to each other, and a gap may be formed between the mask and the substrate. Therefore, the accuracy of an organic thin film deposited on the substrate may be decreased, and a defect may occur in the fabricated substrate.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a mask assembly including a magnetic part provided on one surface of the mask.

Additional aspects will be set forth in the detailed description which follows, and, in part, will be apparent from the disclosure, or may be learned by practice of the inventive concept.

According to an exemplary embodiment, a mask assembly may include: a mask frame; a mask supported by the mask frame, the mask including a plurality of pattern holes; and a magnetic part disposed on one surface of the mask.

The magnetic part may include a magnetic particle and a resin.

The magnetic particle may include a ferromagnetic material.

The magnetic particle may include a plastic particle and a ferromagnetic material coated on the plastic particle.

The size of the magnetic particle may be 0.1 µm to 5 µm.

The resin may include a photocurable resin and/or a thermosetting resin.

A viscosity of the resin may be 1 cp to 2000 cp.

The pattern holes may be arranged in a matrix form along a first direction and a second direction, the second direction orthogonal to the first direction.

The magnetic part may be located between the pattern holes.

The mask may include a rib located between the pattern holes, wherein the magnetic part is located at an intersection portion of the rib.

The mask frame and the mask may be made of a material including a nickel-iron alloy having 36% nickel.

The mask may be a fine metal mask (FMM).

The mask may include a plurality of mask strips.

According to an exemplary embodiment, a method for fabricating a mask assembly may include: forming a mask having a plurality of pattern holes; disposing a magnetic part on one surface of the mask; and magnetically adhering the mask onto a mask frame.

The disposing of the magnetic part may include: disposing a solvent mixture including a magnetic particle and a resin on the one surface of the mask; and curing the solvent mixture.

The magnetic particle may be formed by coating a ferromagnetic material on a plastic particle.

According to an exemplary embodiment, a deposition apparatus may include: a chamber; a deposition source configured to provide a deposition material in the chamber; a mask assembly disposed on one surface of a target substrate facing the deposition source; and a magnet plate disposed on the other surface of the target substrate, the magnet plate is configured to closely adhere the mask assembly onto the target substrate by a magnetic force, wherein the mask assembly includes: a mask frame; a mask supported by the mask frame, the mask including a plurality of pattern holes; and a magnetic part disposed on one surface of the mask.

The magnet plate may include a plurality of magnets.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
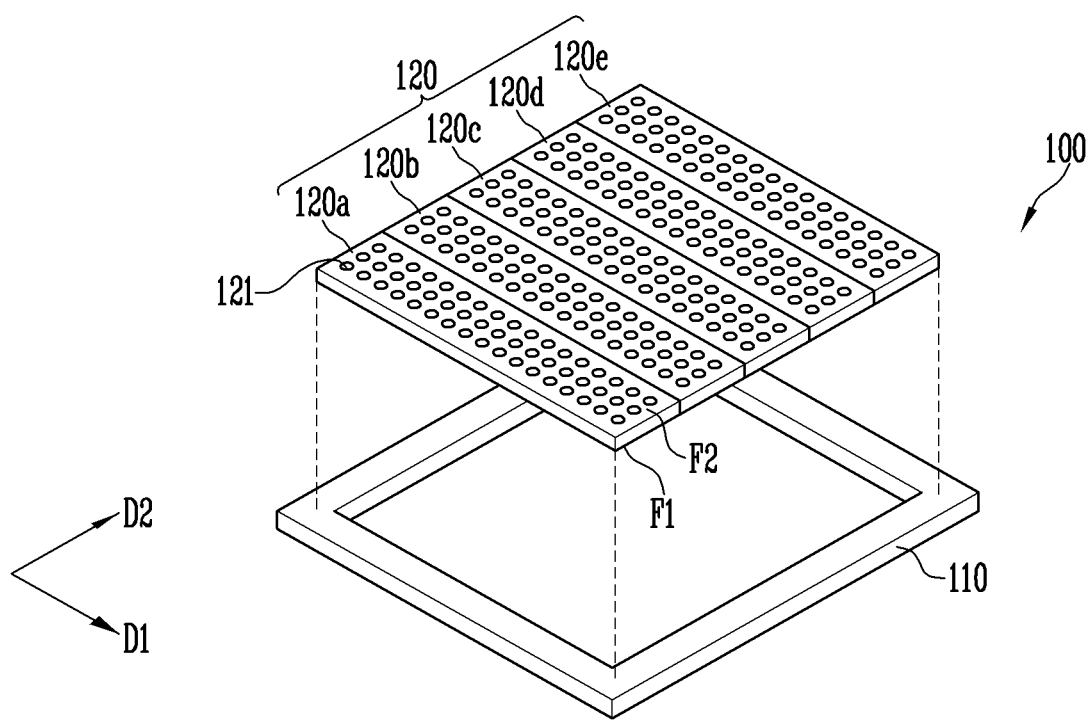
FIG. 1 is a perspective view schematically illustrating a mask assembly according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2A:
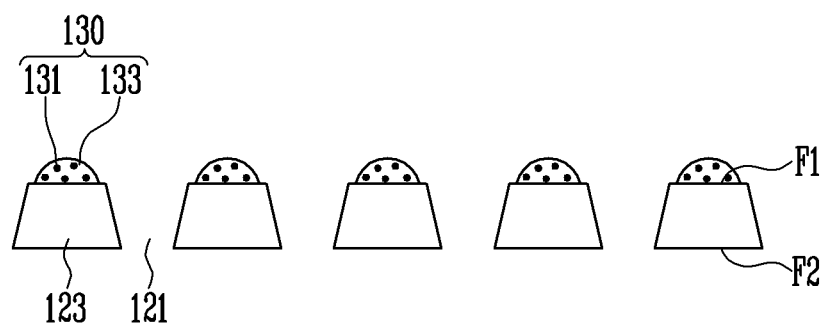
FIG. 2A is a schematic cross-sectional view of a mask of FIG. 1, according to an exemplary embodiment.
Figure 2B:
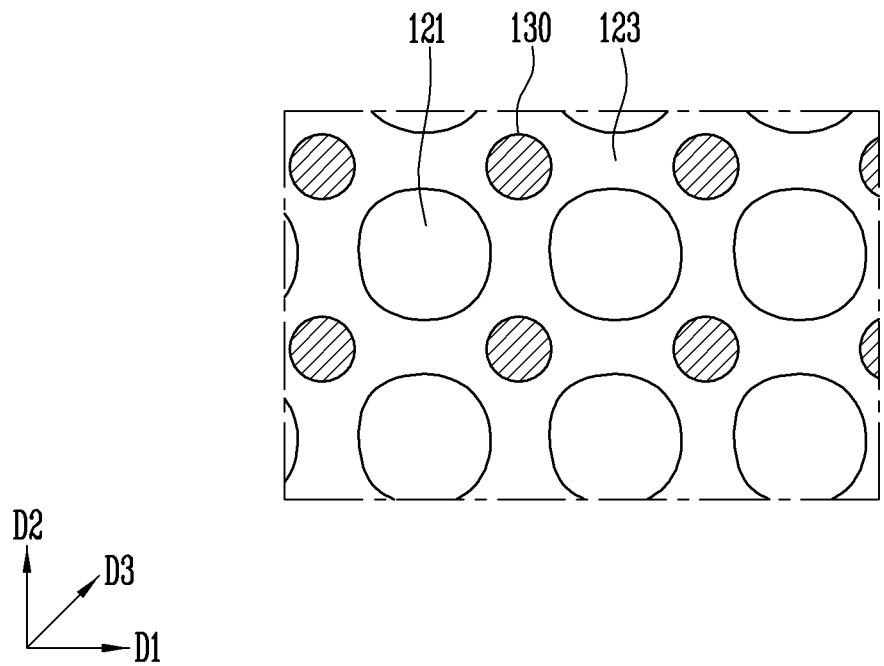
FIG. 2B is an enlarged plan view of the mask of FIG. 1, according to an exemplary embodiment.

FIG. 1 is a perspective view schematically illustrating a mask assembly according to an exemplary embodiment. FIG. 2A is a schematic cross-sectional view of a mask of FIG. 1, according to an exemplary embodiment. FIG. 2B is an enlarged plan view of the mask of FIG. 1, according to an exemplary embodiment.

Referring to FIG. 1, the mask assembly 100 according to the exemplary embodiment includes a mask frame 110, a mask 120, and a magnetic part 130 (see FIGS. 2A and 2B).

The mask frame 110 forms an outer frame of the mask assembly 100 and supports the mask 120. According to an exemplary embodiment, the mask frame 110 may be formed to support an edge of the mask 120, and be welded or clamped to an end portion of the mask 120 to apply a tensile force to the mask 120.

The mask frame 110 and the mask 120 may be attached to each other in various manners. For example, the mask frame 110 and the mask 120 may be attached to each other using fastening members such as bolt and nut, a joint, and/or a clamp, or a screw thread coupling or flange structure to provide a mechanical coupling strength between the mask frame 110 and the mask 120.

According to an exemplary embodiment, the mask frame 110 may be formed in a quadrangular shape having an opening at the center thereof. However, the exemplary embodiments are not limited thereto. For example, the mask frame 110 may be formed in various shapes such as a circular shape, an elliptical shape, and a polygonal shape.

The mask frame 110 may be made of a metal, synthetic resin, or the like. For example, the mask frame 110 may include stainless steel (SUS), a nickel-iron alloy having 36% nickel (INVAR®), nickel, cobalt, and any alloy thereof.

The mask 120 includes a plurality of pattern holes 121 through which a deposition material may pass. The pattern holes 121 correspond to deposition patterns of pixels formed on a target substrate, respectively.

According to an exemplary embodiment, the pattern holes 121 may be arranged in a matrix form along a first direction D1 and a second direction D2, the second direction orthogonal to the first direction D1. According to the exemplary embodiment, the pattern holes 121 have a circular shape. However, the exemplary embodiments are not limited thereto, and the pattern holes 121 may have an elliptical shape or a slit shape.

The mask 120 may include a rib 123 formed between the pattern holes 121. That is, the rib 123 is an area through which the deposition material does not pass.

According to an exemplary embodiment, the mask 120 may include a plurality of mask strips 120a, 120b, 120c, 120d, and 120e. However, the shape and number of the mask strips 120*a*, 120*b*, 120*c*, 120*d*, and 120*e* are illustrative, and the exemplary embodiments are not limited thereto.

The mask 120 may be a fine metal mask (FMM). For example, the mask frame 110 may include stainless steel (SUS), a nickel-iron alloy having 36% nickel (INVAR®), nickel, cobalt, and any alloy thereof.

The mask 120 may be formed through an etching or plating process. For example, forming the mask 120 may be formed by; forming a photoresist layer having patterns same as the pattern holes 121 on a thin plate using a photoresist process, or attaching a film having patterns same as the pattern holes 121 on a thin plate and etching the thin plate. Alternatively, the mask 120 may be formed by electroforming.

According to an exemplary embodiment, a first surface F1 of the mask 120 may be disposed facing a deposition source providing the deposition material, and at least one edge of the first surface F1 may be in contact with the mask from 110. A second surface F2 of the mask 120 may be disposed facing or contacting the target substrate.

The magnetic part 130 may include a material that reacts to a magnet, and is disposed on the first surface F1 of the mask 120. Referring to FIGS. 2A and 2B, the magnetic part 130 may be formed by spraying a solvent mixture including a magnetic particle 131 and a resin 133 onto the first surface F1 of the mask 120 and then curing the solvent mixture.

Specifically, the magnetic part 130 may be entirely or partially formed on the first surface F1 of the mask 120. When the magnetic part 130 is be disposed at a specific position, it may be required to perform a process of spraying the solvent mixture using a separate mask for spraying or a process of precisely aligning the spraying position of an inkjet nozzle. After the solvent mixture is sprayed, the solvent mixture is cured using light and heat.

The magnetic part 130 may increase the magnetic force of the mask 120, the magnetic particle 131 may include a ferromagnetic material such as iron, cobalt, or nickel. The magnetic particle 131 may be formed by forming the entire particle with the ferromagnetic material or by coating the ferromagnetic material onto a plastic particle. The magnetic particle 131 may have a size of 0.1 µm to 5 µm, and the magnetic part 130 may be formed smaller as the size of the magnetic particle 131 becomes smaller.

The resin 133 may include at least one of a photocurable resin and a thermosetting resin. For example, the thermosetting resin may include a urea resin, a melamine resin, a phenol resin, and the like. The photocurable resin may include a polymerizable compound having a polymerizable functional group such as an epoxy resin, a photopolymerization initiator that initiates a polymerization reaction of the polymerizable compound by light irradiation, a surfactant, an antioxidant, and the like. However, the exemplary embodiments are not limited thereto.

According to an exemplary embodiment, the resin 133 may have solventless ultraviolet (UV) curable properties. The resin 133 having the solventless property may be used for the mask 120 used in a vacuum chamber, since a volatile solvent is not included. The viscosity of the resin 133 may be 1 cp to 2000 cp, and the magnetic part 130 may be decreased as the viscosity of the resin 133 becomes lower.

The magnetic part 130 may be located between the pattern holes 121. According to an exemplary embodiment, the magnetic part 130 may be located at an intersection portion of the rib 123. The magnetic part 130 may be located in a third direction D3 with reference to the pattern holes 121, the third direction D3 is between the first direction D1 and the second direction D2 on the same plane. That is, the magnetic part 130 may be formed along an oblique direction with reference to the pattern holes 121 and not in top, bottom, left, and right directions with reference to the pattern holes 121.

Meanwhile, in order to fabricate a high-resolution substrate, the total thickness of the thickness of the mask 120 and the thickness of the magnetic part 130 may be equal to or smaller than 20 µm.

Figure 3:
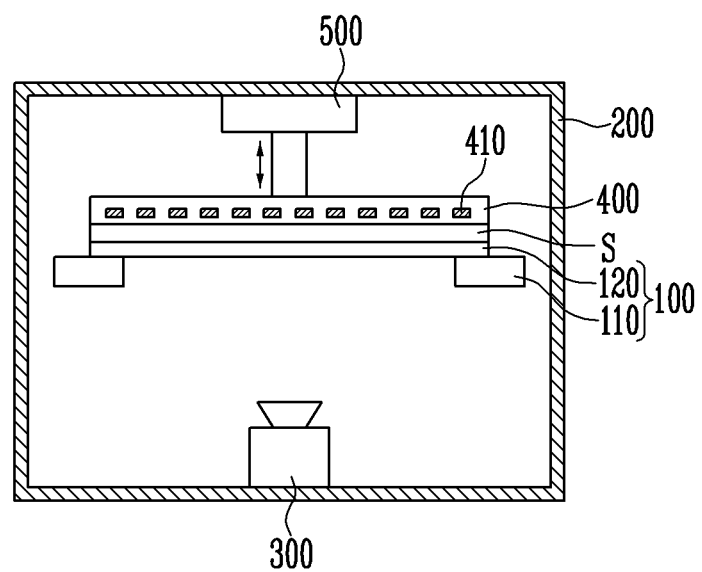
FIG. 3 is a configuration view schematically illustrating a deposition apparatus including the mask assembly according to an exemplary embodiment.

FIG. 3 is a configuration view schematically illustrating a deposition apparatus including the mask assembly according to an exemplary embodiment.

The deposition apparatus of according to the exemplary embodiments, for example, may be a vapor deposition apparatus for fabricating a semiconductor device such as a memory or logic circuit in which a device layer is formed by deposition of a vapor generated from a liquid or solid deposition material or a reaction product thereof, or a vapor deposition apparatus for fabricating a display device such as an organic light emitting diode. Such exemplary embodiments of the deposition apparatus is illustrative, and the deposition apparatus according to the exemplary embodiment may be other devices having photo-optical or electro-mechanical characteristics, e.g., electrochemical cells, photoconductive cells, optical resistors, photoswitches, phototransistors, and phototubes.

Referring to FIG. 3, the deposition apparatus according to the embodiment may include a mask assembly 100, a chamber 200, a deposition source 300, a magnet plate 400, and a driver 500. This embodiment is a deposition apparatus including the above-described mask assembly 100, and therefore, overlapping descriptions of substantially identical components will be omitted to avoid redundancy.

In this embodiment, the deposition apparatus has a structure in which the deposition source 300 is located at a lower portion of the chamber 200, and a target substrate S is disposed between the mask assembly 100 and the magnet plate 400 at an upper portion of the chamber 200. That is, the deposition apparatus has an upper chucking structure in which a deposition process is performed in a state in which the target substrate S is supported such that a surface of the target substrate S to which the deposition material is disposed faces downward.

The target substrate S may be a substrate for fabricating an organic light emitting display panel. However, the target substrate S is not limited to the display panel, and may be a semiconductor substrate for fabricating a semiconductor device such as a wafer.

The chamber 200 provides a space in which a deposition process is performed onto the target substrate S. A vacuum state of a predetermined level may be maintained in the inside of the chamber 200 such that the deposition process can be more smoothly performed, and a vacuum pump to control the vacuum level may be connected to the chamber 200. The chamber 200 may also include a loading/unloading port to load/unload the target substrate S therethrough.

The chamber 200 may be made of a metallic material such as aluminum, stainless steel, or copper. The chamber 200 may be made of a coated metal, e.g., anodized aluminum or nickel-plated aluminum. The chamber 200 may also be made of a refractory metal. The entire or a portion of the chamber 200 may be made of an electrically insulating material such as quartz or ceramic. The structure of the chamber 200 may have a structure suitable to perform the deposition process of the target substrate S, e.g., a circular structure, a quadrangular structure, or any type of structure.

The deposition source 300 may accommodate a deposition material therein and may provide the deposition material evaporated by heating. According to the exemplary embodiments, the deposition source 300 is located at a lower portion of the chamber 200 to provide the deposition material to an upper portion of the chamber 200. The deposition source 300 may include a nozzle part through which the deposition material is sprayed or dispersed.

The deposition source 300 may include a heating part. If a deposition material is charged and heated in the deposition source 300, a vapor of the evaporated deposition material is disposed onto the target substrate S by passing through the pattern holes 121 of the mask 120.

The deposition material may include a high-molecular organic material, a low-molecular organic material, a polymer, an inorganic material, etc. The deposition material may be in a solid or liquid state. The deposition source 300 may include a large amount of deposition material such that the deposition process can be performed for a long period of time. According to the exemplary embodiments, the deposition material may be supplied from the outside of the chamber 200 while a process is being performed.

A material of a portion or the entire of the deposition source 300 may include a metallic material such as stainless steel, aluminum, titanium, or copper, a transparent material through which the inside of the deposition source 300 can be observed, such as quartz or glass, and a thermal insulating material having a heat insulation effect, such as ceramic, or any combination thereof. However, the exemplary embodiments are not limited thereto.

The magnet plate 400 is disposed on the other surface of the target substrate S to adhere the mask assembly 100 closely to the target substrate S by a magnetic force. The magnet plate 400 may include a plurality of magnets 410. The magnets 410 may be permanent magnets or electromagnets.

The driver 500 may be coupled to the magnet plate 400, to move up or down the magnet plate 400.

In summary, in the chamber 200, the mask assembly 100 is disposed onto the one surface of the target substrate S facing the deposition source 300, and the magnet plate 400 is disposed on the other surface of the target substrate S, to adhere the mask assembly 100 to the target substrate S by the magnetic force.

The deposition material in the deposition source 300 is evaporated onto the target substrate S that is closely adhered to the mask assembly 100, and the evaporated deposition material passed through the pattern holes 121 of the mask 120 may form a deposition pattern on the target substrate S. In this case, when the mask 120 and the target substrate S are not adhered closely to each other but spaced apart from each other, the accuracy of the pattern deposited on the target substrate S may decrease, and therefore, a defect may occur.

According to the exemplary embodiments, the magnetic part 130 is provided on one surface of the mask 120 to provide the magnetic force between the mask 120 and the target substrate S and improve the adhesion between the mask 120 and the target substrate S.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method for fabricating a mask assembly, the method comprising:
    forming a mask having a plurality of pattern holes arranged in a matrix form, the mask comprising:
        a first rib, and
        a second rib forming a plurality of intersection portions with the first rib;
    disposing a magnetic part on a surface of the mask; and
    magnetically adhering the mask onto a mask frame, wherein
    the magnetic part is positioned at only each of the plurality of intersection portions of the first rib and the second rib,
    an outline of the magnetic part is spaced apart from the plurality of pattern holes surrounded by the first rib and the second rib on a plane,
    the magnetic part has a first pitch along a first direction and a second pitch along a second direction intersecting the first direction with reference to the plurality of pattern holes, and
    the magnetic part comprises a magnetic particle and a resin.

2. The method of claim 1, wherein the disposing of the magnetic part comprises:
    disposing a solvent mixture comprising the magnetic particle and the resin on the surface of the mask; and
    curing the solvent mixture.

3. The method of claim 2, wherein the magnetic particle is formed by coating a ferromagnetic material on a plastic particle.

* * * * *